United States Patent
Kakkar et al.

(10) Patent No.: US 8,346,529 B2
(45) Date of Patent: Jan. 1, 2013

(54) DELTA RETIMING IN LOGIC SIMULATION

(75) Inventors: Sachin Kakkar, Delhi (IN); John Ries, Wilsonville, OR (US)

(73) Assignee: Mentor Graphics Corporation, Wilsonville, OR (US)

( * ) Notice: Subject to any disclaimer, the term of this patent is extended or adjusted under 35 U.S.C. 154(b) by 357 days.

(21) Appl. No.: 12/648,600

(22) Filed: Dec. 29, 2009

(65) Prior Publication Data
US 2011/0161066 A1 Jun. 30, 2011

(51) Int. Cl.
*G06F 17/50* (2006.01)
*G06F 9/455* (2006.01)
*G06G 7/62* (2006.01)
*G06G 7/54* (2006.01)

(52) U.S. Cl. .......... 703/15; 703/13; 703/14; 703/16; 703/17; 703/18; 703/19; 716/108; 716/113; 716/134

(58) Field of Classification Search .......... 703/13–19; 716/108, 113, 134
See application file for complete search history.

(56) References Cited

U.S. PATENT DOCUMENTS

| | | | | |
|---|---|---|---|---|
| 5,550,760 | A * | 8/1996 | Razdan et al. | 703/14 |
| 5,644,499 | A * | 7/1997 | Ishii | 716/114 |
| 5,784,593 | A | 7/1998 | Tseng et al. | |
| 5,798,938 | A * | 8/1998 | Heikes et al. | 716/108 |
| 5,822,217 | A * | 10/1998 | Shenoy | 716/108 |
| 5,880,967 | A * | 3/1999 | Jyu et al. | 716/113 |
| 6,072,948 | A * | 6/2000 | Saitoh et al. | 703/14 |
| 6,223,141 | B1 * | 4/2001 | Ashar | 703/14 |
| 6,698,006 | B1 * | 2/2004 | Srinivasan et al. | 716/114 |
| 7,047,175 | B1 * | 5/2006 | Jain et al. | 703/19 |
| 7,120,883 | B1 * | 10/2006 | van Antwerpen et al. | 716/102 |
| 7,171,634 | B2 * | 1/2007 | Sawkar et al. | 716/104 |
| 7,257,802 | B2 * | 8/2007 | Daw et al. | 716/104 |
| 7,302,659 | B2 * | 11/2007 | Ja et al. | 716/106 |
| 2005/0289498 | A1 * | 12/2005 | Sawkar et al. | 716/18 |
| 2009/0070720 | A1 * | 3/2009 | Bergamaschi et al. | 716/6 |

OTHER PUBLICATIONS

Arora et al. "Load Redistribution Technique for Timing Optimization", 2009.*
Ghosh et al. "On the Origin of VHDL's Delta Delays", Int. J. Engng Ed. vol. 20, No. 4, pp. 638±645, 2004.*
ModelSim Advanced Verification and Debugging—SE User's Manual. Nov. 2004.*
VCS NCSi User's Guide, Mar. 2008.*
Chen et al. "On retiming for FPGA logic module minimization", Integration, the VLSI journal 24 (1997) 135 145.*
Cong et al. "Multilevel Global Placement with Retiming", 2003.*
Eisenbiegler et al. "A Constructive Approach towards Correctness of Synthesis—Application with Retiming", 2003.*

* cited by examiner

*Primary Examiner* — Shambhavi Patel
(74) *Attorney, Agent, or Firm* — Banner & Witcoff, Ltd.

(57) ABSTRACT

Aspects of the present invention are directed to improving the speed of event-driven simulation by manipulating delta delays in a system model to reduce delta cycle executions. The manipulation is performed in a manner that preserves delta cycle accurate timing on selected signals of the system, which may be of interest to a designer. Methods and systems are provided for identifying the signals of interest, and for determining portions of the design that may have delta delays retimed. Preserving the timing on the signals of interest ensures that race conditions and glitches present in the design on the signals of interest are still viewable by the designer. To reduce simulation time, delta delays may be moved from high activity signals to low activity signals, the total number of delta delays may be reduced, or a number of processes executed may be reduced.

32 Claims, 14 Drawing Sheets

State Table for VHDL Model 1

| Simulation Cycle Time | Delta Cycle Time | CLK | DATA1 | EN | OUT | CLKi | DATA1i | ENi |
|---|---|---|---|---|---|---|---|---|
| 0 | +1 | 0 | 0 | 0 | 0 | 0 | 0 | 0 |
| 5 | +1 | 1 | 0 | 0 | 0 | 0 | 0 | 0 |
| 5 | +2 | 1 | 0 | 0 | 0 | 1 | 0 | 0 |
| 10 | +1 | 0 | 1 | 0 | 0 | 1 | 0 | 0 |
| 10 | +2 | 0 | 1 | 0 | 0 | 0 | 1 | 0 |
| 15 | +1 | 1 | 1 | 0 | 0 | 0 | 1 | 0 |
| 15 | +2 | 1 | 1 | 0 | 0 | 1 | 1 | 0 |
| 20 | +1 | 0 | 0 | 1 | 0 | 1 | 1 | 0 |
| 20 | +2 | 0 | 0 | 1 | 0 | 0 | 0 | 1 |
| 25 | +1 | 1 | 0 | 1 | 0 | 0 | 0 | 1 |
| 25 | +2 | 1 | 0 | 1 | 0 | 1 | 0 | 1 |
| 30 | +1 | 0 | 1 | 1 | 0 | 1 | 0 | 1 |
| 30 | +2 | 0 | 1 | 1 | 0 | 0 | 1 | 1 |
| 35 | +1 | 1 | 1 | 1 | 0 | 0 | 1 | 1 |
| 35 | +2 | 1 | 1 | 1 | 0 | 1 | 1 | 1 |
| 35 | +3 | 1 | 1 | 1 | 1 | 1 | 1 | 1 |
| 40 | +1 | 0 | 0 | 0 | 1 | 1 | 1 | 1 |
| 40 | +2 | 0 | 0 | 0 | 1 | 0 | 0 | 0 |
| 45 | +1 | 1 | 0 | 0 | 1 | 0 | 0 | 0 |
| 45 | +2 | 1 | 0 | 0 | 1 | 1 | 0 | 0 |
| 50 | +1 | 0 | 1 | 0 | 1 | 1 | 0 | 0 |
| 50 | +2 | 0 | 1 | 0 | 1 | 0 | 1 | 0 |
| 55 | +1 | 1 | 1 | 0 | 1 | 0 | 1 | 0 |
| 55 | +2 | 1 | 1 | 0 | 1 | 1 | 1 | 0 |
| 60 | +1 | 0 | 0 | 1 | 1 | 1 | 1 | 0 |
| 60 | +2 | 0 | 0 | 1 | 1 | 0 | 0 | 1 |

FIG. 4A

State Table for VHDL Model 1: Boundary Signals

| Simulation Cycle Time | Delta Cycle Time | CLK | DATA 1 | EN | OUT |
|---|---|---|---|---|---|
| 0 | +1 | 0 | 0 | 0 | 0 |
| 5 | +1 | 1 | 0 | 0 | 0 |
| 10 | +1 | 0 | 1 | 0 | 0 |
| 15 | +1 | 1 | 1 | 0 | 0 |
| 20 | +1 | 0 | 0 | 1 | 0 |
| 25 | +1 | 1 | 0 | 1 | 0 |
| 30 | +1 | 0 | 1 | 1 | 0 |
| 35 | +1 | 1 | 1 | 1 | 0 |
| 35 | +3 | 1 | 1 | 1 | 1 |
| 40 | +1 | 0 | 0 | 0 | 1 |
| 45 | +1 | 1 | 0 | 0 | 1 |
| 50 | +1 | 0 | 1 | 0 | 1 |
| 55 | +1 | 1 | 1 | 0 | 1 |
| 60 | +1 | 0 | 0 | 1 | 1 |

FIG. 4B

State Table for VHDL Model_1 RT

| Simulation Cycle Time | Delta Cycle Time | CLK | DATA1 | EN | OUT | OUTi |
|---|---|---|---|---|---|---|
| 0 | +1 | 0 | 0 | 0 | 0 | 0 |
| 5 | +1 | 1 | 0 | 0 | 0 | 0 |
| 10 | +1 | 0 | 1 | 0 | 0 | 0 |
| 15 | +1 | 1 | 1 | 0 | 0 | 0 |
| 20 | +1 | 0 | 0 | 1 | 0 | 0 |
| 25 | +1 | 1 | 0 | 1 | 0 | 0 |
| 30 | +1 | 0 | 1 | 1 | 0 | 0 |
| 35 | +1 | 1 | 1 | 1 | 0 | 0 |
| 35 | +2 | 1 | 1 | 1 | 0 | 1 |
| 35 | +3 | 1 | 1 | 1 | 1 | 1 |
| 40 | +1 | 0 | 0 | 0 | 1 | 1 |
| 45 | +1 | 1 | 0 | 0 | 1 | 1 |
| 50 | +1 | 0 | 1 | 0 | 1 | 1 |
| 55 | +1 | 1 | 1 | 0 | 1 | 1 |
| 60 | +1 | 0 | 0 | 1 | 1 | 1 |

FIG. 4C

State Table for VHDL Model 1 RT: Boundary Signals

| Simulation Cycle Time | Delta Cycle Time | CLK | DATA 1 | EN | OUT |
|---|---|---|---|---|---|
| 0 | +1 | 0 | 0 | 0 | 0 |
| 5 | +1 | 1 | 0 | 0 | 0 |
| 10 | +1 | 0 | 1 | 0 | 0 |
| 15 | +1 | 1 | 1 | 0 | 0 |
| 20 | +1 | 0 | 0 | 1 | 0 |
| 25 | +1 | 1 | 0 | 1 | 0 |
| 30 | +1 | 0 | 1 | 1 | 0 |
| 35 | +1 | 1 | 1 | 1 | 0 |
| 35 | +3 | 1 | 1 | 1 | 1 |
| 40 | +1 | 0 | 0 | 0 | 1 |
| 45 | +1 | 1 | 0 | 0 | 1 |
| 50 | +1 | 0 | 1 | 0 | 1 |
| 55 | +1 | 1 | 1 | 0 | 1 |
| 60 | +1 | 0 | 0 | 1 | 1 |

FIG. 4D

State Table for VHDL Model 2

| Sim. Cycle Time | Delta Cycle Time | Processes Executed | DATAl:DATA6 | EN1:EN2 | OUT | DATAli:DATA6i | EN1i:EN2i | OUT_MIX | OUT_MIX | OUT_OR1 | OUT_OR1 |
|---|---|---|---|---|---|---|---|---|---|---|---|
| 0 | +1 | 13 | 000000 | 00 | U | UUUUUU | UU | U | U | U | U |
| 0 | +2 | 2 | 000000 | 00 | U | 000000 | 00 | U | U | U | U |
| 0 | +3 | 2 | 000000 | 00 | U | 000000 | 00 | 0 | U | 0 | U |
| 0 | +4 | 1 | 000000 | 00 | U | 000000 | 00 | 0 | 0 | 0 | 0 |
| 0 | +5 | 0 | 000000 | 00 | 0 | 000000 | 00 | 0 | 0 | 0 | 0 |
| 50 | +1 | 4 | 111100 | 00 | 0 | 000000 | 00 | 0 | 0 | 0 | 0 |
| 50 | +2 | 1 | 111100 | 00 | 0 | 111100 | 00 | 0 | 0 | 0 | 0 |
| 50 | +3 | 1 | 111100 | 00 | 0 | 111100 | 00 | 1 | 0 | 0 | 0 |
| 50 | +4 | 1 | 111100 | 00 | 0 | 111100 | 00 | 1 | 1 | 0 | 0 |
| 100 | +1 | 5 | 000000 | 10 | 0 | 111100 | 00 | 1 | 1 | 0 | 0 |
| 100 | +2 | 1 | 000000 | 10 | 0 | 000000 | 10 | 1 | 1 | 0 | 0 |
| 100 | +3 | 1 | 000000 | 10 | 0 | 000000 | 10 | 0 | 1 | 0 | 0 |
| 100 | +4 | 1 | 000000 | 10 | 0 | 000000 | 10 | 0 | 0 | 0 | 0 |
| 150 | +1 | 6 | 111111 | 10 | 0 | 000000 | 10 | 0 | 0 | 0 | 0 |
| 150 | +2 | 2 | 111111 | 10 | 0 | 111111 | 10 | 0 | 0 | 0 | 0 |
| 150 | +3 | 2 | 111111 | 10 | 0 | 111111 | 10 | 1 | 0 | 1 | 0 |
| 150 | +4 | 1 | 111111 | 10 | 0 | 111111 | 10 | 1 | 1 | 1 | 1 |
| 150 | +5 | 0 | 111111 | 10 | 1 | 111111 | 10 | 1 | 1 | 1 | 1 |
| 200 | +1 | 8 | 000000 | 01 | 1 | 111111 | 10 | 1 | 1 | 1 | 1 |
| 200 | +2 | 2 | 000000 | 01 | 1 | 000000 | 01 | 1 | 1 | 1 | 1 |
| 200 | +3 | 2 | 000000 | 01 | 1 | 000000 | 01 | 0 | 1 | 0 | 1 |
| 200 | +4 | 1 | 000000 | 01 | 1 | 000000 | 01 | 0 | 0 | 0 | 0 |
| 200 | +5 | 0 | 000000 | 01 | 0 | 000000 | 01 | 0 | 0 | 0 | 0 |
| 250 | +1 | 6 | 111111 | 01 | 0 | 000000 | 01 | 0 | 0 | 0 | 0 |
| 250 | +2 | 2 | 111111 | 01 | 0 | 111111 | 01 | 0 | 0 | 0 | 0 |
| 250 | +3 | 2 | 111111 | 01 | 0 | 111111 | 01 | 1 | 0 | 1 | 0 |
| 250 | +4 | 1 | 111111 | 01 | 0 | 111111 | 01 | 1 | 1 | 1 | 1 |
| 250 | +5 | 0 | 111111 | 01 | 1 | 111111 | 01 | 1 | 1 | 1 | 1 |

Total Processes Executed: 68

FIG. 6A

State Table for VHDL Model 2: Boundary Signals

| Sim. Cycle Time | Delta Cycle Time | DATA1 : DATA6 | EN1 : EN2 | OUT |
|---|---|---|---|---|
| 0 | +1 | 000000 | 00 | U |
| 0 | +5 | 000000 | 00 | 0 |
| 50 | +1 | 111100 | 00 | 0 |
| 100 | +1 | 000000 | 10 | 0 |
| 150 | +1 | 111111 | 10 | 0 |
| 150 | +5 | 111111 | 10 | 1 |
| 200 | +1 | 000000 | 01 | 1 |
| 200 | +5 | 000000 | 01 | 0 |
| 250 | +1 | 111111 | 01 | 0 |
| 250 | +5 | 111111 | 01 | 1 |

FIG. 6B

State Table for VHDL Model 2 RT

| Sim. Cycle Time | Delta Cycle Time | Processes Executed | DATA1:DATA6 | EN1:EN2 | OUT | OUT_MUX | OUT_OR1 | OUT1 | OUT2 |
|---|---|---|---|---|---|---|---|---|---|
| 0 | +1 | 5 [8] | 000000 | 00 | U | U | U | U | U |
| 0 | +2 | 1 [1] | 000000 | 00 | U | 0 | 0 | U | U |
| 0 | +3 | 1 [1] | 000000 | 00 | U | 0 | 0 | 0 | U |
| 0 | +4 | 1 | 000000 | 00 | U | 0 | 0 | 0 | 0 |
| 0 | +5 | 0 | 000000 | 00 | 0 | 0 | 0 | 0 | 0 |
| 50 | +1 | 1 [3] | 111100 | 00 | 0 | 0 | 0 | 0 | 0 |
| 50 | +2 | 1 | 111100 | 00 | 0 | 1 | 0 | 0 | 0 |
| 100 | +1 | 1 [4] | 000000 | 10 | 0 | 1 | 0 | 0 | 0 |
| 100 | +2 | 1 | 000000 | 10 | 0 | 0 | 0 | 0 | 0 |
| 150 | +1 | 2 [4] | 111111 | 10 | 0 | 0 | 0 | 0 | 0 |
| 150 | +2 | 1 [1] | 111111 | 10 | 0 | 1 | 1 | 0 | 0 |
| 150 | +3 | 1 [1] | 111111 | 10 | 0 | 1 | 1 | 1 | 0 |
| 150 | +4 | 1 | 111111 | 10 | 0 | 1 | 1 | 1 | 1 |
| 150 | +5 | 0 | 111111 | 10 | 1 | 1 | 1 | 1 | 1 |
| 200 | +1 | 2 [6] | 000000 | 01 | 1 | 1 | 1 | 1 | 1 |
| 200 | +2 | 1 [1] | 000000 | 01 | 1 | 0 | 0 | 1 | 1 |
| 200 | +3 | 1 [1] | 000000 | 01 | 1 | 0 | 0 | 0 | 1 |
| 200 | +4 | 1 | 000000 | 01 | 1 | 0 | 0 | 0 | 0 |
| 200 | +5 | 0 | 000000 | 01 | 0 | 0 | 0 | 0 | 0 |
| 250 | +1 | 2 [4] | 111111 | 01 | 0 | 0 | 0 | 0 | 0 |
| 250 | +2 | 1 [1] | 111111 | 01 | 0 | 1 | 1 | 0 | 0 |
| 250 | +3 | 1 [1] | 111111 | 01 | 0 | 1 | 1 | 1 | 0 |
| 250 | +4 | 1 | 111111 | 01 | 0 | 1 | 1 | 1 | 1 |
| 250 | +5 | 0 | 111111 | 01 | 1 | 1 | 1 | 1 | 1 |

Total Processes Executed:  27

FIG. 6C

State Table for VHDL Model 2 RT: Boundary Signals

| Sim. Cycle Time | Delta Cycle Time | DATA1 : DATA6 | EN1 : EN2 | OUT |
|---|---|---|---|---|
| 0 | +1 | 000000 | 00 | U |
| 0 | +5 | 000000 | 00 | 0 |
| 50 | +1 | 111100 | 00 | 0 |
| 100 | +1 | 000000 | 10 | 0 |
| 150 | +1 | 111111 | 10 | 0 |
| 150 | +5 | 111111 | 10 | 1 |
| 200 | +1 | 000000 | 01 | 1 |
| 200 | +5 | 000000 | 01 | 0 |
| 250 | +1 | 111111 | 01 | 0 |
| 250 | +5 | 111111 | 01 | 1 |

FIG. 6D

DELTA RETIMING IN LOGIC SIMULATION

FIELD OF THE INVENTION

Aspects of the present invention are directed generally to logic design simulation and more particularly to improving simulation speed by manipulating timing delays in a logic model to reduce delta cycle executions.

BACKGROUND OF THE INVENTION

In electronic design automation, simulators are used to autonomously interpret a system specification (e.g., a logic design model), and to simulate the behavior of the system over a simulated period of time. The system may be specified at various levels of detail and may include various elements. For example, a specification for a digital electronic circuit may be described at an algorithm level, at a register-transfer-level (RTL), or at a gate level.

An algorithm level specification describes the relationship between a set of inputs to a set of outputs using a set of computations. At a more detailed register transfer level, the system is described in terms of interconnected combinatorial logic blocks and registers (memory storage devices). At an even more detailed gate-level description level, the system may be described in terms of physical transistors.

As the level of detail increases, simulation of the system requires a more detailed treatment of the propagation of information through the system over time. For example, in RTL logic, the behavior of the circuit involves a time sequence of periodic data transfers, from register to register, through combinatorial blocks which transform the data according to logical rules.

The level of detail required in the simulation depends on the purpose of the simulation. For example, to determine if the circuit is logically correct, assumptions can be made to simplify the simulation. In a RTL design for example, the data transfers from register to register may be assumed to occur simultaneously on a periodic basis (e.g., on clock cycles) and the transformation and propagation of the data through the combinatorial blocks may be assumed to occur instantaneously (e.g., with zero delay). This is the approach taken by a class of simulators called cycle-based simulators. While cycle based simulators are useful for initial logic design and are fast, they are inherently inaccurate and can lead to undetected race conditions and glitches which otherwise would have been caught by simulators that take into account propagation delays and real world factors such as clock skew. A designer using a cycle based simulator has to ensure that designs are cycle accurate and loss of this information will not affect their verification results.

At the other end of the spectrum, a class of analog circuit simulators, such as SPICE, may be used to determine precise circuit behavior by calculating the state of every signal at every step in a sequence of time instances. However, analog type simulators require a prohibitive amount of computation to be useful in simulating most digital systems.

In between cycle based simulators and analog simulators, are a class of simulators called event-driven simulators, which model the propagation of data between and through design elements as a sequence of events having non-zero delays. In contrast to a cycle based simulator, an event-driven simulator permits a designer to examine the propagation of data within a single clock cycle. However, unlike analog simulators, event-driven simulators do not model every iteration of time, but calculate data only at events (e.g., at changes in the state of the system).

To perform event-driven simulation, a concept of a delta delay is introduced. A delta delay is an infinitesimally small advance in time that is simulated to have occurred for each event. The delta delays allows events to be ordered in sequence in a deterministic way that preserves the causal effect of an event occurring at one instant in time (e.g., the input to a logic gate changing) to another event occurring at a later instant in time (e.g., the output of the logic gate changing). For example, in a RTL design, within the simulation of one clock cycle, a signal at the input of a combinatorial block may change causing an event. This event may cause a subsequent event on the output of the combinatorial block, which may cause a subsequent event at the input of another combinatorial block connected downstream to the first combinatorial block, and so on. As events are simulated, more events may be created. The event-driven simulator handles these events by building an event queue which evaluates each event in the order they occur. Because each event in the queue occurs in a simulated delta delay, events are simulated in delta time cycles which reflect the order in which events occur, but which do not advance the simulated time cycle.

While event-driven simulation is much more efficient than full analog simulation, the more delta cycles that are created during simulation, the longer the simulation takes to run. For many designs, event-driven simulation can still be time prohibitive. However, it is often the case in these designs that the designer is only concerned with observing accurate simulation of a limited number of signals, like primary outputs and inputs or elements within the design. For these cases, it is desirable to reduce the complexity of the simulation, while maintaining the delta-accurate event based simulation of the limited number of desired signals and elements.

BRIEF SUMMARY OF THE INVENTION

To reduce the run time penalty of event-driven simulators, aspects described herein use delta retiming to more efficiently simulate a design.

According to a first illustrative aspect, a method is presented for increasing the efficiency of computer code generated by a circuit compiler for event-driven simulation of a logic design by retiming delta delays. The delta delays are retimed in a manner that preserves the delta cycle behavior of specified regions of logic design, but reduces the estimated number of delta cycles performed in the event-driven simulation of the entire design.

In another illustrative aspect, delta retiming is performed by shifting delta delays from regions with a high probability of activity to regions with a low probability of activity. By moving the delta delays to lower activity regions, the probability of events in the simulation triggering the evaluation of a delta delay is reduced, and thus, the probability of new events being generated and queued for execution is reduced.

In another illustrative aspect, delta retiming is performed by reducing the number of delta delays in the design by moving the delta delays from regions of high fan-in to regions of low fan-out, and from regions of high fan-out to regions of low fan-in. In yet another aspect, delta retiming is performed by modifying elements to logically equivalent elements with a reduced number of delta delays or reduced switching frequency of delta delays.

In yet another illustrative aspect, delta retiming in logic models is applied to event driven simulation of other system models with zero duration delta delays and non-zero duration propagation delays.

BRIEF DESCRIPTION OF THE DRAWINGS

FIGS. 4A-4D show illustrative embodiments of state tables for the sequential logic designs of FIG. 3.

FIG. 5 shows another illustrative embodiment of delta cycle retiming performed on multiple levels of a combinatorial logic design with a high fan-in.

FIGS. 6A-6D show illustrative embodiments of state tables for the combinatorial logic designs of FIG. 5.

DETAILED DESCRIPTION OF THE INVENTION

Operating Environment

Figure 1:
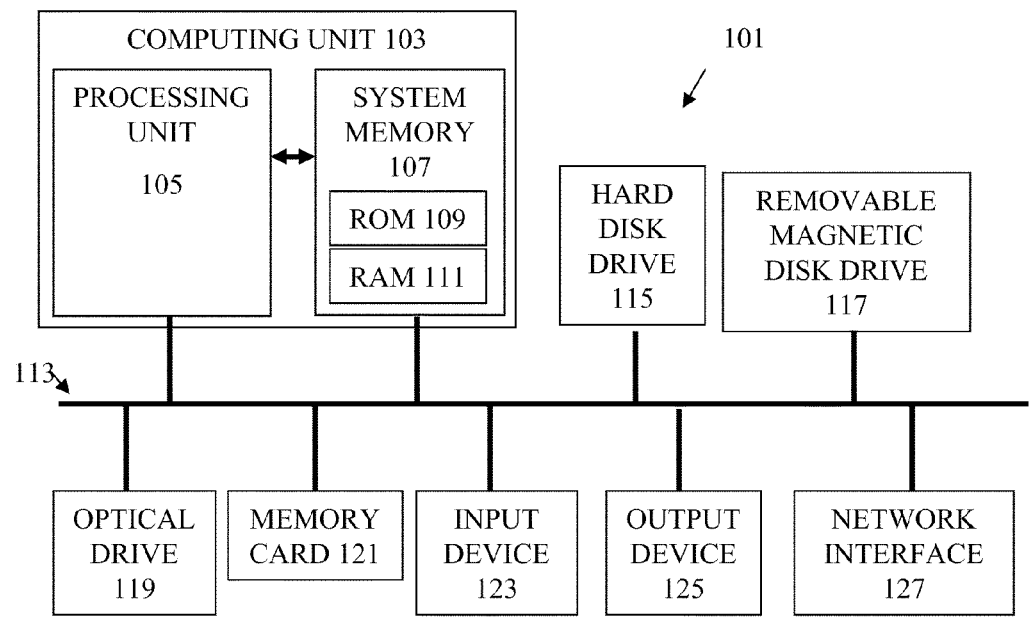
FIG. 1 shows an illustrative embodiment of a computing platform on which delta retiming may be performed.

Various examples of the invention may be implemented through the execution of software instructions by a computing device, such as a programmable computer. Accordingly, FIG. 1 shows an illustrative example of a computing device 101. As seen in this figure, the computing device 101 includes a computing unit 103 with a processing unit 105 and a system memory 107. The processing unit 105 may be implemented with any of numerous types of devices, including but not limited to one or more general purpose microprocessors, one or more application specific integrated circuits, one or more field programmable gate arrays, and combinations thereof. The system memory 107 may include both a read-only memory (ROM) 109 and a random access memory (RAM) 111. As will be appreciated by those of ordinary skill in the art, both the read-only memory (ROM) 109 and the random access memory (RAM) 111 may store machine readable instructions (e.g., software, firmware, etc.) for execution by the processing unit 105. The machine readable instructions may also be stored as hardwired logic gates within processing unit 105.

The processing unit 105 and the system memory 107 are connected, either directly or indirectly, through a bus 113 or alternate communication structure, to one or more peripheral devices. For example, the processing unit 105 or the system memory 107 may be directly or indirectly connected to one or more additional memory storage devices, such as a "hard" magnetic disk drive 115, a removable magnetic disk drive 117, an optical disk drive 119, or a flash memory 121. The processing unit 105 and the system memory 107 also may be directly or indirectly connected to one or more input devices 123 and one or more output devices 125. The input devices 123 may include, for example, a keyboard, a pointing device (such as a mouse, touchpad, stylus, trackball, or joystick), a scanner, a camera, and a microphone. The output devices 125 may include, for example, a monitor display, a printer and speakers. With various examples of the computer 101, one or more of the peripheral devices 115-125 may be internally housed with the computing unit 103. Alternately, one or more of the peripheral devices 115-125 may be external to the housing for the computing unit 103 and connected to the bus 113 through, for example, a Universal Serial Bus (USB) connection.

With some implementations, the computing unit 103 may be directly or indirectly connected to one or more network interfaces 127 for communicating with other devices making up a network. The network interface 127 translates data and control signals from the computing unit 103 into network messages according to one or more communication protocols, such as the transmission control protocol (TCP) and the Internet protocol (IP). Also, the interface 127 may employ any suitable connection circuit (or combination of circuit) for connecting to a network, including, for example, a wireless transceiver, a modem, or an Ethernet connection.

It should be appreciated that the computer 101 is illustrated as an example only, and it not intended to be limiting. Various embodiments of the invention may be implemented using one or more computing devices that include the components of the computer 101 illustrated in FIG. 1, which include only a subset of the components illustrated in FIG. 1, or which include an alternate combination of components, including components that are not shown in FIG. 1. For example, various embodiments of the invention may be implemented using one or more general purpose computers, a multi-processor computer, an array of single or multiprocessor computers arrayed into a network, or some other combination of various computing devices.

System Specification

Description data in any format that is understood by the event-driven simulator may be used to specify a system to be simulated. While the disclosed embodiments are not specific to any standard for specifying a system, hardware description languages (HDLs) such as the VHSIC hardware description language (VHDL) are often used for specifying illustrative digital logic systems. Verilog, SystemVerilog (SV), and System C are other illustrative languages used for specifying systems.

Figure 2:
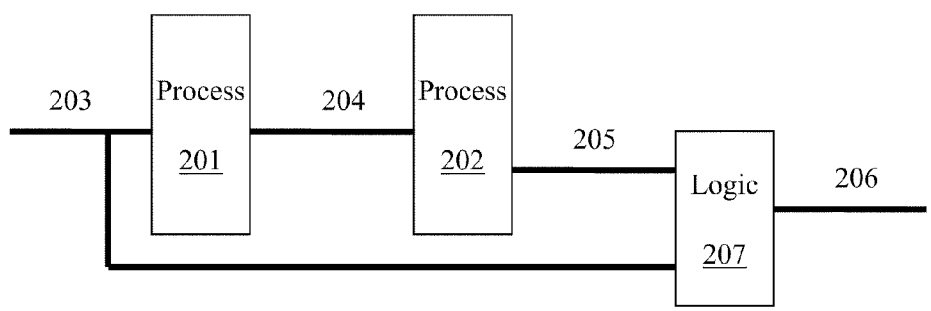
FIG. 2 shows an illustrative system on which various embodiments may be performed.

Using VHDL by way of example, a system may be described as a set of processes and signal assignments which execute concurrently in simulated time and which communicate using signals. The simulated time is modeled in steps called simulation cycles (e.g., one clock cycle). In VHDL, before simulation begins, the design hierarchy is first elaborated. Elaboration is where all the pieces of the model code (entities, architectures, and configurations) are assembled into a flattened design. FIG. 2 illustrates an illustrative system with process 201 and process 202 interconnected by signals 203, 204, and 205. Outside of the process, signal 206 is assigned as a logical combination of signals 205 and 203, through logic block 207.

Before the first simulation cycle begins, every signal in the system is initialized. The signals always have a current value during the entire simulation, which is updated as the simulation progresses. A signal is said to be active if there is an update to the current value. When the update causes the current value on an active signal to change state (e.g., from a "1" to a "0"), an event results. If an event results on a signal driving a process or a signal assignment (e.g., event on 203 driving process 201), the process or assignment is executed (simulated). Once the simulation of a process is started, the process runs continuously, with statements in the process being executed, and new events within the process being generated, until the process suspends itself (e.g., no more events to evaluate). If the process creates any new events outside of the process, those events would continue to be evaluated until no more events remained. When no more events are left to process in the entire system, the simulation cycle ends. Subsequent simulation cycles are then continuously repeated based on the current values determined in the previous simulation cycle. Event-driven simulators utilize a stratified event queue which maintains the execution order of statements within the model, and which executes all signal assignments activated by an event before the current values of signals are updated and before the next event in the queue executes. Assignments which are executed, but whose effect on a signal is delayed until all other activated assignments have been executed are referred to as Non-blocking Assignments (NBAs).

Delta Cycles

In the VHDL Model 1 example below, four concurrent statements are shown: concurrent signal assignments on lines 10, 11, and 12, and the process "FLOP" on lines 14-20. In event-driven simulation, each signal assignment is assumed to occur over a delta time delay, an infinitesimally small advance in time.

VHDL Model 1

```
1   entity case1 is
2       port (DATA1, EN1, CLK: in std_logic; OUT : out_std_logic);
3   end entity;
4
5   architecture case1 of case1 is
6       signal DATA1i, EN1i, CLKi : std_logic;
7
8   begin
9
10      DATA1i    <= DATA1;
11      EN1i      <= EN1;
12      CLKi      <= CLK;
13
14      FLOP: process (DATA1i, EN1i, CLKi)
15          begin
16              if(CLKi'event and CLKi = '1') then
17                  if(EN1i = '1') then OUT <= DATA1i;
18                  end if;
19              end if;
20          end process;
21
22  end case1;
```

By way of a simulation example of VHDL Model 1, assume that the signal CLK transitions from a "0" to a "1" at the beginning of every simulation cycle. Further assume that for a particular simulation cycle, the signal DATA1 transitions from a "0" to a "1." The signals CLK and DATA1 are said to be active, and because a transition occurred on each, events were created for each signal. Each event triggers the execution of an assignment which is sensitive to that event. For the CLK event, the assignment on line 12 is triggered, assigning the current value of CLK to CLKi. For the DATA1 event, the assignment on line 10 is triggered, assigning the current value of DATA1 to DATA1i. Because these assignments are concurrent, they are evaluated within the same time step of a delta cycle, which has the duration of one delta delay.

The executed assignments caused new transactions on CLKi and DATA1i. Assuming that the values on CLKi and DATA 1i changed, two new events were created. The process Flop is sensitive to these events which trigger execution of the process. The process executes by sequentially evaluating each statement within the process. Although the statements are evaluated sequentially, the current value of signals which have changed as a result of the statements are not updated until all statements have been executed (i.e. these are NBAs). The updating of the current values of all of the signals assigned during one execution pass of the statements in the process occurs simultaneously over a delta cycle. If a new event is created within the process, assignments sensitive to the new event are evaluated over a subsequent delta cycle. The process continues until no more events are created.

FIG. 4A illustrates the relationship of signal transitions in the previous example in relationship to simulation cycle time and delta cycle time. As illustrated, one, two or three delta cycles are generated for every simulation cycle. Note that the delta cycles do not advance the simulation cycle time, but they ensure that the simulation of the system progresses deterministically and maintains a sequence of causal relationships between values propagated on the signals within the design. Also note that after the 0 ns simulation cycle, the second delta cycle always occurs because the CLK signal is active in every simulation cycle, but that the output signal of the process, OUT, changes only in the 35 ns simulation cycle causing a third delta cycle. Simulating the precise behavior on every signal is useful to the designer when the designer is interested in analyzing all of the signals. Often however, the designer is only interested in a few signals. For example, in the example of simulating VHDL Model 1, the designer may only be interested in analyzing the external signals, CLK, EN, DATA1, and OUT and may not be concerned with the internal signals, CLKi, ENi, and DATA1i. FIG. 4B illustrates the same timing information as 4A, but only for the external signals the designer may be interested in.

Delta Retiming

To reduce the run time of event-driven simulation, various embodiments are presented which modify the simulation to reduce the number of delta cycles and the number of internal processes calculated while preserving the delta cycle behavior of the values propagated on the signals of interest.

Figure 3:
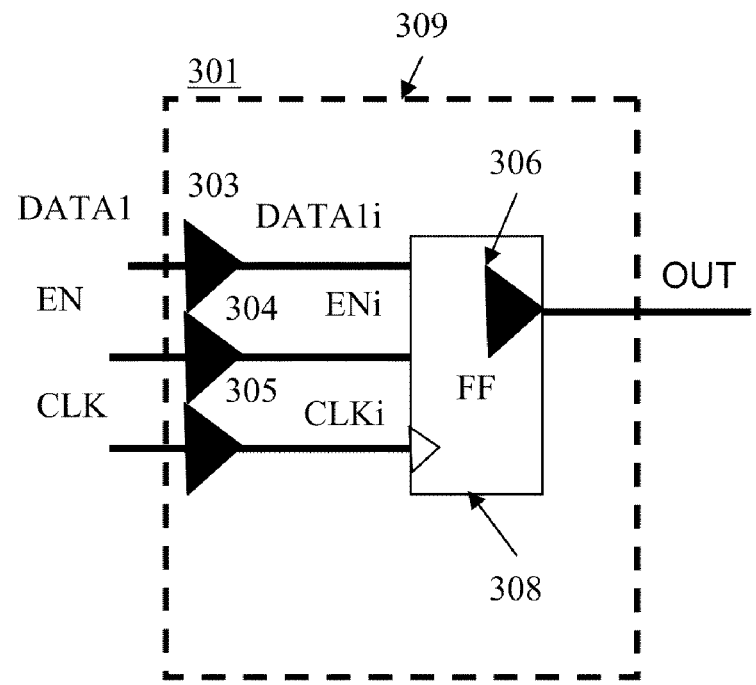
FIG. 3 shows an illustrative embodiment of delta cycle retiming performed on a sequential logic design.
Figure 3:
Figure 3:
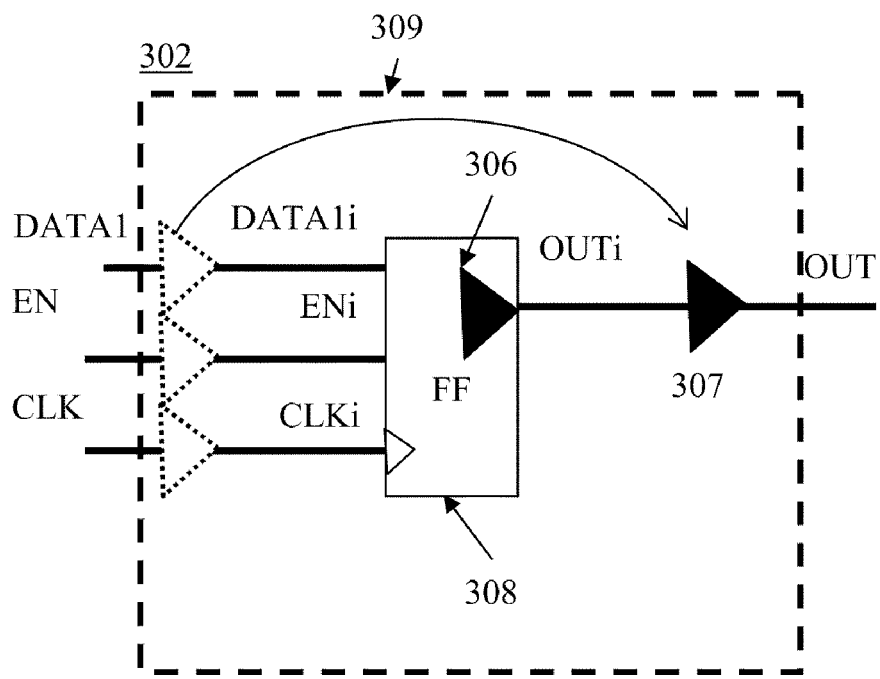

One illustrative embodiment for how delta delays are moved while maintaining the delta cycle behavior of a logic design is illustrated in FIG. 3 using the VHDL Model 1 as an example. FIG. 3, block 301 illustrates the logic design, a flip-flop register 308, specified by VHDL Model 1. The design specified in VHDL Model 1 may be the entire design, or may be just a small portion of the design. The boundary 309 drawn around the circuit represents the area outside of which the delta accurate behavior will be maintained. Delta delays are represented by 303-306. Delta delays 303, 304, and 305 represent the delta delays that occur as a result of evaluating the non-blocking signal assignments on lines 10, 11, and 12 respectively of VHDL Model 1. Delta delay 306 represents the delta delay resulting from the evaluation of the embedded "If" statement on lines 16-19 within process FLOP. As illustrated in block 302, delta delays 303-305 may be moved (i.e. re-timed), by replacing them with one new delta delay 307 at the output of the circuit. An illustrative re-timed specification for the logic circuit in 302 is illustrated below as VHDL Model 1 RT. Comparing the retimed model with the original model, the intermediate signals (and processes), DATA1i, ENi, and CLKi at the input have been removed, and a new intermediate signal OUTi has been added.

VHDL Model 1 RT

```
1   entity case1_rt is
2       port (DATA1, EN1, CLK: in std_logic; OUT : out std_logic);
3   end entity;
4
5   architecture case1_rt of case1_rt is
6       signal OUTi : std_logic;
7
8   begin
9
10      FLOP: process (DATA1, EN1, CLK)
11          begin
12              if(CLK'event and CLK = '1') then
13                  if(EN1 = '1') then OUTi <= DATA1;
14                  end if;
15              end if;
16          end process;
17
```

```
18      OUT <= OUTi;
19
20   end case1_rt;
```

FIG. 4C illustrates the delta cycle timing of the retimed model. FIG. 4D represents the same timing information as in FIG. 4C, but only for the external signals outside of the boundary (i.e., the signals of interest). Comparing the delta cycle timing of the external signals of interest in the retimed circuit (FIG. 4D) to the delta cycle timing of the external signals of interest in the original logic model (FIG. 4B), the delta cycle times are identical. However, comparing the full delta cycle timing of the original and retimed logic model (FIG. 4A and FIG. 4C), delta cycles where the external signals do not change have been eliminated. In the 35 ns simulation cycle, the same sequence of three delta cycles is duplicated with CLK changing in the 1st delta cycle and OUT changing in the 3rd delta cycle. But in the remainder of the simulation cycles, because none of the external signals change, simulation of the delta cycles that were in the original VHDL Model 1 become unnecessary and can be eliminated.

Illustrative examples of delta retiming may reduce execution time by moving delta delays from more active elements to less active elements. This is illustrated in the previous example of retiming VHDL Model 1 where the delta delay on the CLK signal, which is a highly active signal transitioning every 5 ns, was moved forward to the OUT signal, which is active less frequently. Moving delta delays to less active signals results in new events being generated less frequently. For sequential systems, such as those using many flip-flops which are clocked at regular intervals, moving delta delays from highly active signals such as clocks, to less active signals, may result in significant simulation time savings.

Figure 5:
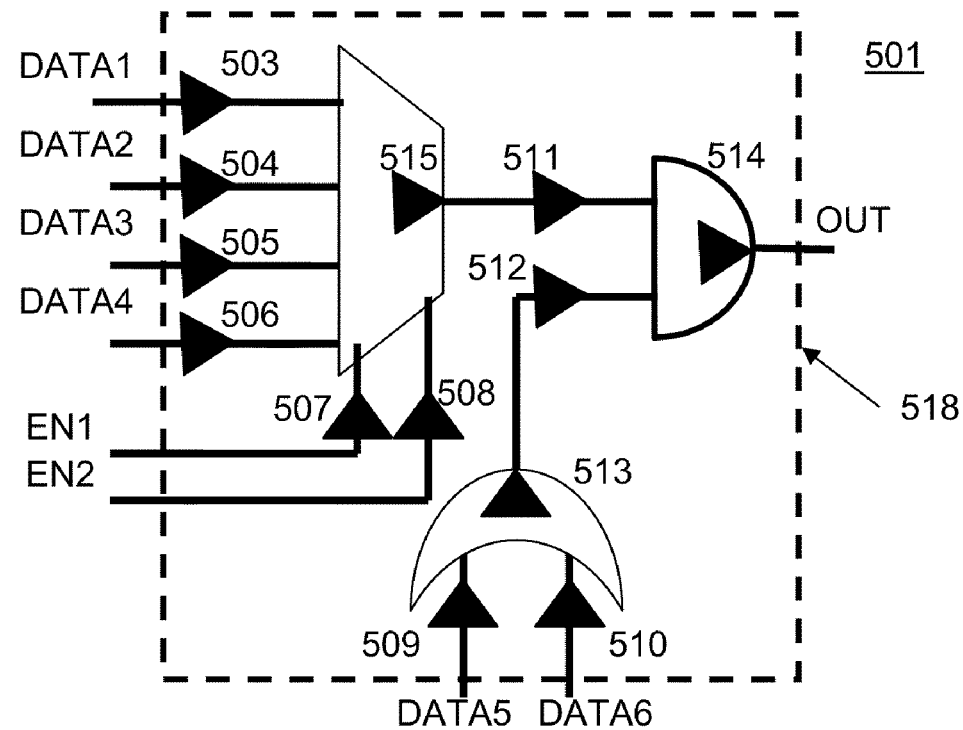
Figure 5:
Figure 5:
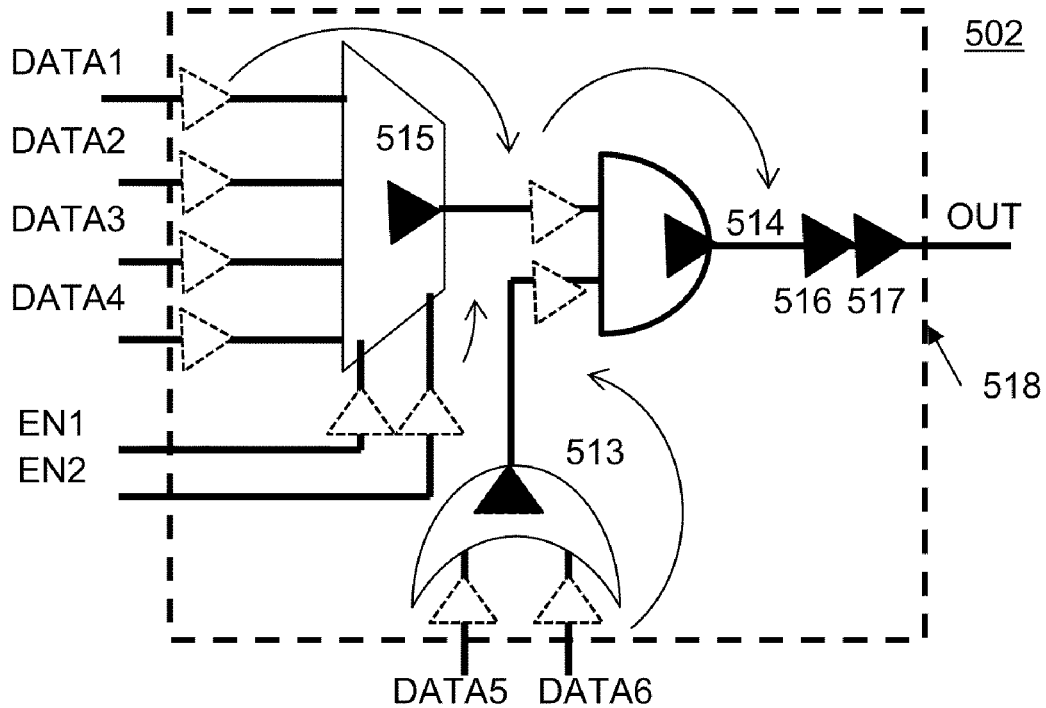

Another illustrative example of delta retiming may reduce execution time by reducing the total number of delta delays (e.g., processes) to execute. The retiming example of VHDL Model 1 illustrates this where three delta delays (303-305) were replaced by only a single delta delay (307). Such reduction in delta delays may lead to less event creation and may also lead to less processes being executed. FIG. 5 is illustrative of another example where the total number of delta delays is reduced.

FIG. 5 illustrates delta retiming where delta delays are moved forward from the input of a combinatorial circuit with a large fan-in, to the output of the combinatorial circuit with a small fan-out. As shown below, the reduction in delta delays in FIG. 5 reduces the number of events being created and also reduces the total number of processes that may be executed.

In FIG. 5, block 501 illustrates the logic design, a cascade of combinatorial logic elements, specified by VHDL Model 2 (provided below). Like in the retiming of VHDL Model 1, boundary 518 drawn around the circuit 501 represents the area outside of which the delta cycle timing behavior is maintained. Delta delays are represented by 503-517. Delta delays 503-510 result from evaluating the non-blocking assignments on lines 13-20 respectively of VHDL Model 2. Delta delay 515 represents the delta delay resulting from the evaluation of the case statement on lines 25-28 within process MUX, delta delay 513 results from the evaluation of the assignment in the OR1 process on line 36, delta delay 514 results from the evaluation of the assignment in the AND1 process on line 43, and delta delays 511 and 512 result from the evaluation of assignments for intermediate signals on lines 32 and 39 respectively.

VHDL Model 2

```
1    entity case2 is
2         port ( DATA1, DATA2, DATA3, DATA4, EN1, EN2, DATA5, DATA6 : in
3              std_logic; OUT : out std_logic) ;
4    end entity;
5
6    architecture case2 of case2 is
7         signal DATA1i, DATA2i, DATA3i, DATA4i, DATA5i;
8         signal DATA6i, EN1i, EN2i : std_logic;
9         signal OUT_MUX, OUTi_MUX, OUT_OR1, OUTi_OR1 : std_logic;
10
11       begin
12
13       DATA1i <= DATA1;
14       DATA2i <= DATA2;
15       DATA3i <= DATA3;
16       DATA4i <= DATA4;
17       DATA5i <= DATA5;
18       DATA6i <= DATA6;
19       EN1i <= EN1;
20       EN2i <= EN2;
21
22       Mux: process (DATA1i, DATA2i, DATA3i, DATA4i, EN1i, EN2i)
23            begin
24            case std_logic_vector'( EN1i & EN2i ) is
25                 when "00" => OUTi_MUX <= DATA1i;
26                 when "01" => OUTi_MUX <= DATA2i;
27                 when "10" => OUTi_MUX <= DATA3i;
28                 when others => OUTi_MUX <= DATA4i;
29            end case;
30       end process;
31
32       OUT_MUX <= OUTi_MUX;
33
34       OR1:process(DATA5i, DATA6i)
35            begin
36            OUTi_OR1 <= DATA5i or DATA6i;
37       end process;
```

```
38
39        OUT_OR1 <= OUTi_OR1;
40
41        AND1:process(OUT_OR1,OUT_MUX)
42           begin
43              OUT <= OUT_OR1 and OUT_MUX;
44           end process;
45
46   end case2;
```

As illustrated in block 502, delta delays 503-510 at the input of the block and intermediate delta delays 511 and 512 may all be moved (i.e. re-timed), by replacing them with two new delta delays 516 and 517 at the output of the circuit, one new delay for each stage of the logic. An illustrative re-timed specification for the logic circuit in 502 is illustrated below, as VHDL Model 2 RT.

VHDL Model 2 RT

```
1    entity case2_rt is
2        port ( DATA1, DATA2, DATA3, DATA4, EN1, EN2, DATA5,
             DATA6 :
3            in std_logic; OUT : out std_logic) ;
4    end entity;
5
6    architecture case2_rt of case2_rt is
7        signal OUT_MUX, OUT_OR1 : std_logic;
8        signal OUTi, OUTi2 : std_logic;
9
10       begin
11
12       Mux: process (DATA1, DATA2, DATA3, DATA4, EN1,
             EN2)
13           begin
14              case std_logic_vector'( EN1 & EN2 ) is
15                 when "00" => OUT_MUX <= DATA1;
16                 when "01" => OUT_MUX <= DATA2;
17                 when "10" => OUT_MUX <= DATA3;
18                    when others => OUT_MUX <= DATA4;
19              end case;
20           end process;
21
22       OR1:process(DATA5, DATA6)
23           begin
24              OUT_OR1 <= DATA5 or DATA6;
25           end process;
26
27       AND1:process(OUT_OR1,OUT_MUX)
28           begin
29              OUTi <= OUT_OR1 and OUT_MUX;
30           end process;
31
32       OUTi2 <= OUTi;
33       OUT <= OUTi2;
34
35   end case2_rt;
```

FIGS. 6A and 6C illustrate delta cycle timing of VHDL Model 2 for an illustrative test bench simulation before and after delta cycle retiming respectively. As shown in FIG. 6A, transitions at the inputs of the large fan-in combination block create new events that propagate through to intermediate assignments, creating subsequent new events, which propagate further, and so on. (The signal transitions that cause the next event to be created are underlined.)

Comparison of FIGS. 6A and 6C at the 50 ns and 100 ns simulation cycles illustrates that for certain bit pattern changes at the input of the circuit, the reduction in the number of delta delays resulting from retiming delays leads to the number of events generated to decrease. For example, in the 50 ns and 100 ns simulation cycles, DATA5 and DATA6 do not transition, resulting in the output of the AND staying static and causing no further events. In the 50 ns and 100 ns simulation cycles in FIG. 6A, delta cycles three and four are wasted in the original model for calculating events on elements within the boundary, but which do not propagate to a signal of interest (i.e., OUT). FIG. 6C illustrates how, in the retimed VHDL Model 2 RT, delta time cycles three and four are eliminated in the 50 ns and 100 ns simulation cycles. For other bit pattern changes in other simulation cycles, the retiming preserves the delta cycle timing for the OUT signal where a transition does propagate through.

FIGS. 6B and 6D illustrate the same timing information as in FIGS. 6A and 6C respectively, but only for the external signals outside of the boundary (i.e., the signals of interest). As shown by comparing FIGS. 6B and 6D, the delta cycle timing of the external signals of interest are identical for the original and retimed models.

Delta retiming further reduces execution time by reducing the number of processes executed over the same number of delta cycles. FIGS. 6A and 6C illustrate the number of processes executed for each delta cycle step. For example, in the first delta cycle of the 150 ns simulation cycle of the original model illustrated in FIG. 6A, six processes (lines 13-18 of VHDL Model 2) are executed resulting from the transitions of DATA1 to DATA6. In the very first delta cycle of the 0 ns simulation cycle, it is assumed that every process is executed. As illustrated in FIG. 6A and FIG. 6C, the total number or processes executed is reduced from 68 to 27. The amount of reduction for each delta cycle is indicated in square brackets ([ ]) in FIG. 6C. Some of the reduction results from less events being created, as in the 50 ns and 100 ns simulation cycles. However, much of the reduction occurs in the cases where the delta cycle timing is preserved for the signals of interest. For example, in the 200 ns simulation cycle, executed processes are reduced from eleven to five over the same five delta cycles.

Figure 7:
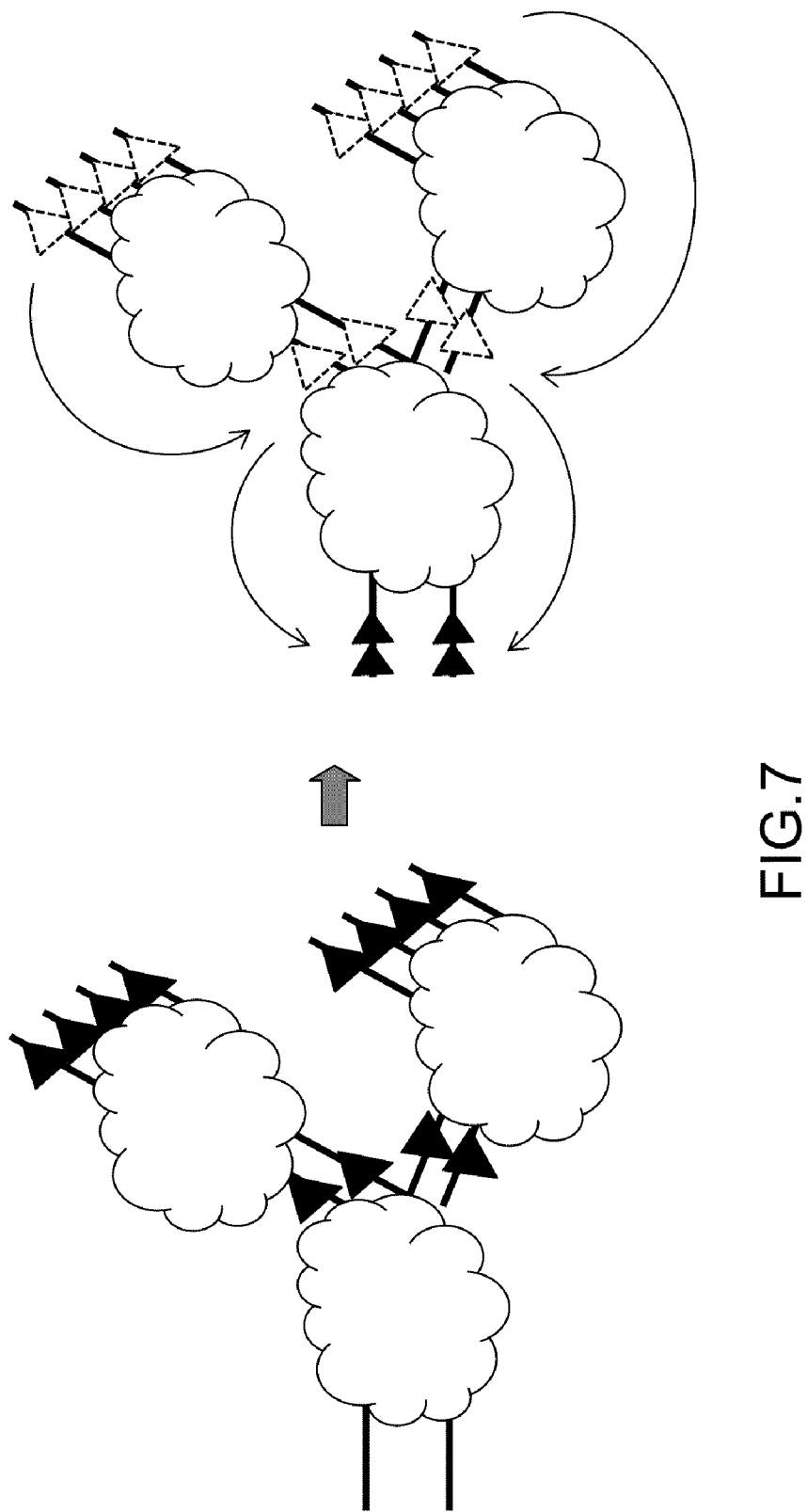
FIG. 7 shows another illustrative embodiment of delta retiming performed on a high fan-out logic cloud.

While FIG. 5 and VHDL Model 2 illustrate an embodiment performing forward delta retiming in which delta delays in a high fan-in region are moved forward to a low fan-out region of a logic block, other embodiments using the same methodology perform backward delta retiming in which delta delays in a high fan-out region are moved backward to a low fan-in region. FIG. 7 illustrates at least one illustrative embodiment of backward delta retiming applied to a multi-stage high fan-out circuit, with combinatorial and sequential systems represented by logic clouds. The methodology applied in FIG. 7 is the same as in the forward delta retiming of the VHDL Model 2 example.

Figure 8:
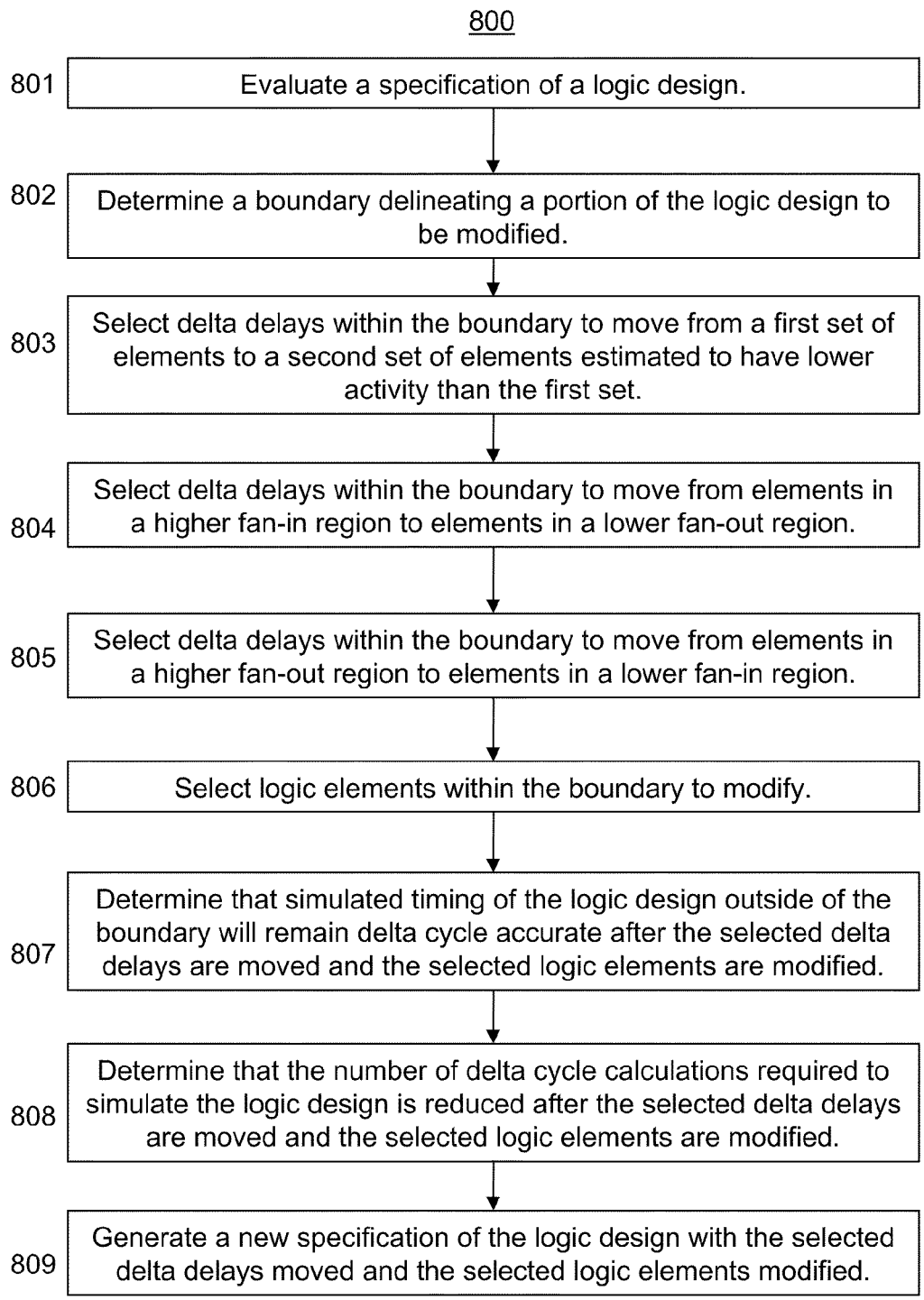
FIG. 8 shows an illustrative method of performing delta cycle retiming.

FIG. 8 is a flowchart of an illustrative method for performing delta cycle retiming by transforming a specification of a logic design into a new specification which may be more efficiently simulated, but which maintains delta cycle accuracy. In FIG. 8 method 800 begins at step 801 where a specification of a logic design is evaluated. Evaluation may include interpreting the specification according to rules which define the specification's format, and may also include elaborating the design by assembling the various pieces of the logic design (entities, architectures, and configurations) together. Evaluation may further include analyzing the specification to identify delta delays in the design, identify the logic used to connect those deltas, and determine evaluation order of assignments.

In step 802, a boundary is determined to delineate a portion of the logic design to be retimed (modified). Determining the boundary may be autonomous based on rules for interpreting the specification. For example, the boundary may be selected such that only top level signals in a design hierarchy are preserved for close scrutiny by a designer. As another example, portions of the specification which fit standard patterns interpreted to represent real elements of a circuit with well known and predictable timing might not be preserved because the timing might not be of interest to the designer. As a still further example, the boundary may be determined by a designer indicating signals and elements of interest, either through selecting the signals and elements in a graphical display or by providing a data file to an EDA computing device. As presented in the above examples, timing for the logic model outside of the boundary is preserved. However, in other illustrative embodiments, the boundary may enclose the portion of the logic model to preserve, and permit delta retiming outside of the boundary perimeter. Further, several boundaries may be determined within a single logic model.

In step 803, delta delays within the portion of the logic model to be retimed (inside or outside of the boundary) are autonomously selected based on moving the delta delays from elements estimated to have higher activity to elements estimated to have lower activity. Elements of the logic model refer to signals, logic blocks, ports on the logic blocks, variables, devices, inputs, outputs, and any other structure in the specification that may be modeled to have a delta delay. Elements may be sequential or combinatorial. Step 803 may include analyzing the logical or functional connection between the delta delays to obtain a probabilistic estimate of switching activity of various connected delta delays. Estimated activity may further be based on previous simulations of the logic model, or based on other heuristics of the analyzed design structure.

In step 804, delta delays within the portion of the logic model to be retimed are autonomously selected based on moving the delta delays from elements in higher fan-in regions to elements in lower fan-out regions. Likewise, in step 805, delta delays within the portion of the logic model to be retimed are selected based on moving the selected delta delays from elements in higher fan-out regions to elements in lower fan-in regions.

In step 806 elements themselves may be selected to be modified or combined into new elements which perform equivalent functions, but that have reduced switching activity or have a reduced number of delta delays. For example, the VHDL non-blocking assignments, "a<=x AND y; b<=z AND w; c<=a AND b;" may be modified into one logically equivalent non-blocking assignment "c<=x AND y AND z AND w;". Of course, more complicated modifications may be accomplished. Step 806 may include processes, such as using simple Boolean algebra transformations, which guarantee the modified circuit is correct by design. Step 806 may also include other processes for selecting equivalent blocks and include processes for verifying equivalence between blocks. These processes may, for example, match behavior or coding style of a logic block to a known library of elements, and utilize, for example binary decision diagrams or conjunctive normal form satisfiability (SAT) solvers to verify equivalence. Determining equivalence may depend on the level of abstraction of the model in the specification and may further depend on other criteria for defining what equivalence is between the unmodified and modified elements.

In step 807, the changes selected in steps 803, 804, 805, and 806 to the logic model, are evaluated and determined to preserve the delta cycle accuracy of the logic model outside of the portion that is being retimed (modified). Delta cycle accuracy may not be exactly preserved with respect to the exact delta delays added or removed, but may only be preserved with respect to the relative delta accuracy of all signals at boundaries. By preserving the relative delta cycle accuracy at the boundaries, any glitch or race condition at the boundary will still be viewable by a designer during simulation. Where the algorithms of steps 803 to 806 preserve the delta cycle accuracy by design, such as in algorithms using Boolean transformations, step 807 may not be performed. When step 807 is performed, the step may involve determining functional equivalence between the original logic model and the retimed logic model. The same methods discussed in step 806 may be utilized.

In step 808, the changes to the logic model selected in steps 803-806 are evaluated and determined to reduce an estimated number of delta cycle calculations required to simulate the logic model. The estimate may be based on the rules, assumptions, analysis, and heuristics used in steps 803-806 for selecting delta delays or modifying elements. For example, the estimate of the number of delta cycle calculations may be based on factors which include the differences in estimated switching frequency of signals with delta delays before and after retiming, the reduction in the number of processes/delta delays before and after retiming, or the fan-in to fan-out ratio of the logic block being retimed.

In step 809, based on determining that delta cycle timing is preserved in step 807 and based on estimating that the number of delta cycles is reduced in step 808, a new specification for the logic model is generated that includes the modifications selected in steps 803-806. The new specification may be in the same format as the original specification, or may be transformed into a new format. The new specification may for example be an optimized sequence of machine instructions coded to perform the simulation of the modified logic model. Steps 801 to 809 may be combined into fewer steps, may have steps deleted, or may have steps rearranged in different orders. The process 800 may also be performed iteratively in a sequence of several repeated steps.

While the process in FIG. 8 provides illustrative aspects directed to delta retiming in a logic model, the concepts disclosed are equally applicable to other illustrative embodiments for event-driven simulation of any complex system. Such embodiments may include retiming of specifications for event-driven simulation of network traffic (e.g., ATM networks), neural networks, or any physical system by transforming description data in the specifications into new description data which may be more efficiently simulated, but which maintain event and propagation delay accuracy.

Figure 9:
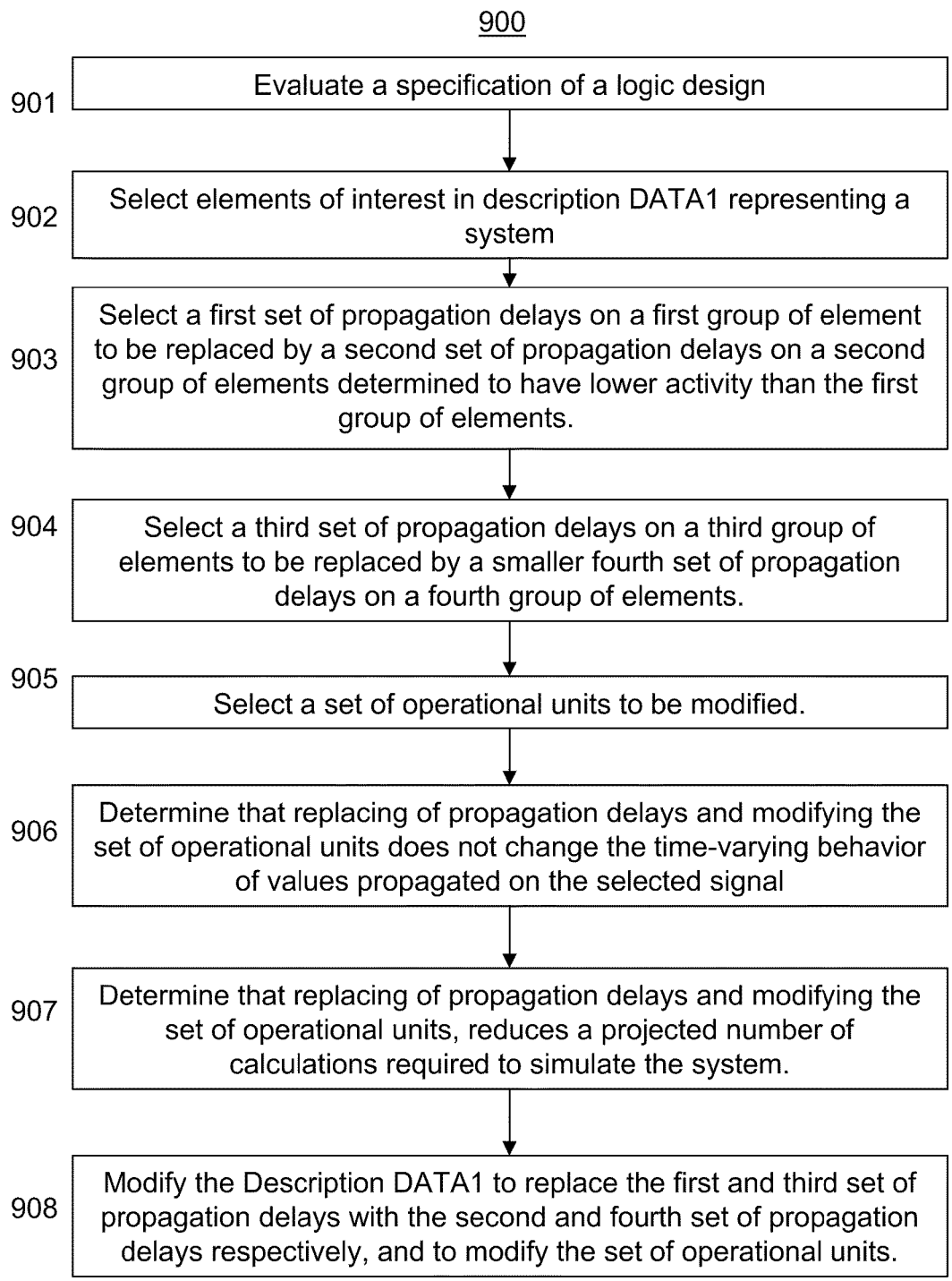
FIG. 9 shows another illustrative method of performing retiming.

FIG. 9 shows another illustrative method for performing retiming in a system which may be modeled using event-driven simulation. In FIG. 9 method 900 begins at step 901 where a specification containing description data of the system is evaluated. Like step 801 in FIG. 8, evaluation may include interpreting the specification according rules which define the specifications format, and may also include elaborating the design by assembling the various pieces of the system. The system may be composed of inputs, outputs, operational units (or functional blocks) which have ports that are interconnected by signals. Data or values are propagated in time along the signals to and from the operational units which may transform the data or values according to sets of rules. The rules and all of these elements in the system may be representative of real physical behavior of the system being modeled. Evaluation may further include analyzing the specification to identify delays of the data or values being propagated on the signals and transformed in the operational units. The evaluation may determine the functional connections between the delays, and determine evaluation order of assignments. The delays may be delta delays with zero simulation time delay as in the example of FIG. 8, or the delay may be a propagation delay with a non-zero simulation time delay.

In step 902, elements of interest (e.g., signals, operational units, ports, etc.) are selected within the description data. For the elements of interest, the relative propagation delays between all elements of interest will be preserved to the same resolution as in the unmodified system model. Determining the elements of interest may be autonomous based on rules for interpreting the specification. For example, the elements of interest may be selected such that only top level elements in a design hierarchy are preserved for close scrutiny by a designer. As another example, portions of the specification which fit standard formats that are interpreted to represent real physical elements of the system being modeled with predictable timing may not be preserved, because the timing would already be known, and thus, not be of interest to the designer. As a still further example, the elements of interest may be determined from selections by a designer explicitly, either through selecting the elements in a graphical display or by providing a data file to a simulation computing platform. Once the elements of interest are selected, step 902 may include determining portions of the system model that may be retimed such that the propagation delay timing of the elements of interest is unaffected. Determining the portions to be retimed may be the same as determining the boundaries in step 802 of FIG. 8 described above.

In step 903, a set of propagation delays within the portions of the system model to be retimed are selected based on replacing the set of propagation delays on a group of elements estimated to have higher activity with another set of propagation delays on another group of elements estimated to have lower activity. Step 903 may include analyzing the functional or operational connections within the system to obtain a probabilistic estimate of switching activity of various sets of propagation delays. Estimated activity may further be based on previous simulations of the system, or based on other heuristics of the analyzed system structure.

In step 904, propagation delays within the portions of the system model to be retimed are selected based on replacing a set of propagation delays with a smaller set of propagation delays. Step 904 may include other illustrative aspects of the same methods applied in steps 804 and 805 in FIG. 8 based on fan-in and fan-out.

In step 905 operational units or functional blocks themselves may be selected to be modified or combined into new blocks which perform equivalent functions, but that have reduced switching activity or have a reduced number of propagation delays. Step 905 may include processes for selecting equivalent circuits and include processes for verifying equivalence. Determining equivalence may depend on the level of abstraction of the system model, the actual physical system being modeled, and on other criteria for defining what equivalence is between the unmodified and retimed system.

In step 906, the changes selected in steps 903-905 to the system model are evaluated and determined to preserve the relative propagation delay accuracy of the selected system elements to the same fidelity permitted by the unmodified system model. This step may involve determining functional equivalence between the original system model and the retimed system model.

In step 907, the changes to the system model selected in steps 903-905 are further evaluated and determined to reduce an estimated number of calculations required to simulate the system. The estimate may be based on the rules, assumptions, analysis, and heuristics used in steps 903-905 for selecting propagation delays or modifying elements.

In the final step 908, based on determining that propagation delay accuracy is preserved in step 906 and based on estimating that the number of calculations is reduced in step 907, the description data in the specification for the system model is transformed to include the changes selected in steps 903-905. The modified specification may be in the same format as the original specification, or may be in a new format. Like the new specification generated in process 800 of FIG. 8, the modified specification generated by process 900 may, for example, be an optimized sequence of machine instructions coded to perform the simulation of the modified system model. Steps 901 to 908 may be combined into fewer steps, may have steps deleted or may have step rearranged in different orders. Further, process 900 may be performed iteratively in a sequence of several repeated steps.

While the examples of the various embodiments have been given using VHDL specifications, other illustrative embodiments may use specification types such as Verilog, SystemVerilog and SystemC adapted to model event-driven systems. Additional embodiments may use intermediate data description formats which are utilized internally by EDA or other design simulation tools. Embodiments may utilize, as non-limiting examples, text, binary, graphical, or graphed based specifications for system model retiming. Illustrative embodiments may use a mix of specification types and description data and may utilize one format for the original specification or description data, and utilize a different format as the re-timed specification or description data.

The foregoing description of embodiments has been presented for purposes of illustration and description. The foregoing description is not intended to be exhaustive or to limit embodiments of the present invention to the precise form disclosed, and modifications and variations are possible in light of the above teachings or may be acquired from practice of various embodiments. The embodiments discussed herein were chosen and described in order to explain the principles and the nature of various embodiments and their practical application to enable one skilled in the art to utilize the present invention in various embodiments and with various modifications as are suited to the particular use contemplated. The features of the embodiments described herein may be combined in all possible combinations of methods, apparatuses, modules, systems, and machine-readable storage memory. Any and all permutations of features from the above-described embodiments are within the scope of the invention.

The invention claimed is:

1. A method comprising:
   receiving as input, description data representing a system for simulation, said system including operational units having a plurality of ports interconnected by a plurality of signals, wherein one or more ports of the plurality of ports is associated with one or more propagation delays;
   identifying a signal of the plurality of signals according to predetermined criteria;
   determining that a modification to the description data that alters the one or more propagation delays preserves a time-varying behavior of a value propagated on the identified signal in a simulation and reduces a projected number of calculations required for performing the simulation; and based on the determining, transforming the description data to include the modification that alters the one or more propagation delays, wherein the simulation includes a real time cycle having a simulated non-zero duration and delta time cycles having delta delays ordered to occur in a sequence within the real time cycle without advancing the real time cycle, wherein each of the plurality of propagation delays is one of the delta delays simulated within one or more of the delta time cycles.

2. The method of claim 1, further comprising:
autonomously selecting the modification such that the one or more propagation delays are replaced with a fewer number of one or more other propagation delays,
wherein the determining that the modification to the description data reduces a projected number of calculations required for performing the simulation is based on the description data having the fewer number of one or more other propagation delays.

3. The method of claim 1, further comprising:
autonomously selecting the modification such that the one or more propagation delays are replaced with one or more other propagation delays on one or more other ports having less activity,
wherein the determining that the modification to the description data reduces a projected number of calculations required for performing the simulation is based on determining that the one or more other ports have less activity than the one or more ports.

4. The method of claim 1, further comprising:
determining that a modification to the description data that alters one or more of the operational units preserves a time-varying behavior of a value propagated on the identified signal in a simulation and reduces a projected number of calculations required for performing the simulation; and
based on the determining, altering the description data to include the modification that alters the one or more of the operational units.

5. The method of claim 1, wherein the simulation of the system is event-driven.

6. The method of claim 1, wherein the system represented by the description data comprises a logic level circuit specified in a hardware description language.

7. The method of claim 6, wherein the altering of the description data translates the description data into a sequence of computer readable instructions executable for performing the simulation.

8. The method of claim 1, wherein the transforming is performed autonomously on the description data stored in a computer readable memory by an electronic design automation simulator operating on a processor.

9. The method of claim 1, further comprising:
retrieving the predetermined criteria from a data file stored in a computer readable memory.

10. A method comprising:
determining within a specification of a logic design, a boundary delineating a portion of the logic design to be modified, wherein the logic design includes signals interconnecting ports of logic elements; and
generating a new specification of the logic design by moving one or more delta delays on one or more of the ports within the delineated portion, such that, in a simulation of the logic design, delta cycle timing outside of the delineated portion remains unchanged, and such that an estimated number of delta cycle calculations in the simulation is reduced.

11. The method of claim 10, wherein, to reduce the estimated number of delta cycle calculations in the simulation, the one or more delta delays are moved from ports with estimated higher activity to ports with estimated lower activity.

12. The method of claim 10, wherein, to reduce the number of delta cycle calculations in the simulation, a number of the delta delays are reduced by moving the one or more delta delays from a fan-in region of a logic portion to a fan-out region of the logic portion having less ports than the fan-in region.

13. The method of claim 10, wherein, to reduce the number of delta cycle calculations in the simulation, a number of the delta delays are reduced by moving the one or more delta delays from a fan-out region of a logic portion to a fan-in region of the logic portion having less ports than the fan-out region.

14. The method of claim 10, wherein the generating the new specification of the logic design further includes:
modifying one or more of the logic elements within the delineated portion such that, in the simulation, the delta cycle timing outside of the delineated portion remains unchanged, and such that the estimated number of delta cycle calculations in the simulation is reduced.

15. The method of claim 10, wherein the new specification includes a sequence of machine executable instructions for performing the simulation of the logic design.

16. An apparatus comprising:
a processor; and
memory storing machine executable instructions, that when executed by the processor, cause the apparatus to:
determine within a specification of a logic design, a boundary delineating a portion of the logic design to be modified, wherein the logic design includes signals interconnecting ports of logic elements; and
generate a new specification of the logic design by moving one or more delta delays on one or more of the ports within the delineated portion, such that, in a simulation of the logic design, delta cycle timing outside of the delineated portion remains unchanged, and such that an estimated number of delta cycle calculations in the simulation is reduced.

17. The apparatus of claim 16, wherein, to reduce the estimated number of delta cycle calculations in the simulation, the one or more delta delays are moved from ports with estimated higher activity to ports with estimated lower activity.

18. The apparatus of claim 16, wherein, to reduce the estimated number of delta cycle calculations in the simulation, a number of the delta delays are reduced by moving the one or more delta delays from a fan-in region of a logic portion to a fan-out region of the logic portion having less ports than the fan-in region.

19. The apparatus of claim 16, wherein, to reduce the estimated number of delta cycle calculations in the simulation, a number of the delta delays are reduced by moving the one or more delta delays from a fan-out region of a logic portion to a fan-in region of the logic portion having less ports than the fan-out region.

20. The apparatus of claim 16, wherein the generating the new specification of the logic design further includes:
modifying one or more of the logic elements within the delineated portion such that, in the simulation, the delta cycle timing outside of the delineated portion remains unchanged, and such that the estimated number of delta cycle calculations in the simulation is reduced.

21. The apparatus of claim 16, wherein the new specification includes a sequence of other machine executable instructions for performing the simulation of the logic design.

22. Computer readable memory storing machine executable instructions, that when executed by a processor, cause a system to:
  determine within a specification of a logic design, a boundary delineating a portion of the logic design to be modified, wherein the logic design includes signals interconnecting ports of logic elements; and
  generate a new specification of the logic design by moving one or more delta delays on one or more of the ports within the delineated portion, such that, in a simulation of the logic design, delta cycle timing outside of the delineated portion remains unchanged, and such that an estimated number of delta cycle calculations in the simulation is reduced.

23. The computer readable memory of claim 22, wherein, to reduce the estimated number of delta cycle calculations in the simulation, the one or more delta delays are moved from ports with estimated higher activity to ports with estimated lower activity.

24. The computer readable memory of claim 22, wherein, to reduce the estimated number of delta cycle calculations in the simulation, a number of the delta delays are reduced by moving the one or more delta delays from a fan-in region of a logic portion to a fan-out region of the logic portion having less ports than the fan-in region.

25. The computer readable memory of claim 22, wherein, to reduce the estimated number of delta cycle calculations in the simulation, a number of the delta delays are reduced by moving the one or more delta delays from a fan-out region of a logic portion to a fan-in region of the logic portion having less ports than the fan-out region.

26. The computer readable memory of claim 22, wherein the generating the new specification of the logic design further includes:
  modifying one or more of the logic elements within the delineated portion such that, in the simulation, the delta cycle timing outside of the delineated portion remains unchanged, and such that the estimated number of delta cycle calculations in the simulation is reduced.

27. The computer readable memory of claim 22, wherein the new specification includes a sequence of other machine executable instructions for performing the simulation of the logic design.

28. The method of claim 1, wherein the simulation varies values propagated through each operational unit according to rules for that operational unit.

29. The method of claim 1, wherein the delta delays each has a simulated zero duration.

30. The method of claim 10, wherein the delta delays each have a simulated zero duration.

31. The apparatus of claim 16, wherein the delta delays each have a simulated zero duration.

32. The computer readable memory of claim 22, wherein the delta delays each have a simulated zero duration.

* * * * *